(12) United States Patent
Ourselin et al.

(10) Patent No.: US 9,702,955 B2
(45) Date of Patent: Jul. 11, 2017

(54) APPARATUS AND METHOD FOR CORRECTING SUSCEPTIBILITY ARTEFACTS IN A MAGNETIC RESONANCE IMAGE

(71) Applicant: UCL Business PLC, London (GB)

(72) Inventors: Sebastien Ourselin, London (GB); Pankaj Daga, London (GB)

(73) Assignee: UCL BUSINESS PLC, London (GB)

( * ) Notice: Subject to any disclaimer, the term of this patent is extended or adjusted under 35 U.S.C. 154(b) by 0 days.

(21) Appl. No.: 14/764,094

(22) PCT Filed: Jan. 31, 2014

(86) PCT No.: PCT/GB2014/050268
§ 371 (c)(1),
(2) Date: Jul. 28, 2015

(87) PCT Pub. No.: WO2014/118559
PCT Pub. Date: Aug. 7, 2014

(65) Prior Publication Data
US 2015/0362575 A1 Dec. 17, 2015

(30) Foreign Application Priority Data
Feb. 1, 2013 (GB) .................................. 1301795.9

(51) Int. Cl.
*G06K 9/00* (2006.01)
*G01R 33/565* (2006.01)
(Continued)

(52) U.S. Cl.
CPC ....... *G01R 33/565* (2013.01); *G01R 33/5608* (2013.01); *G01R 33/5616* (2013.01);
(Continued)

(58) Field of Classification Search
None
See application file for complete search history.

(56) References Cited

U.S. PATENT DOCUMENTS

| 6,445,182 | B1 | 9/2002 | Dean et al. |
| 2013/0093423 | A1* | 4/2013 | Gulsun ............ G01R 33/56545 324/309 |

FOREIGN PATENT DOCUMENTS

WO 2012129585 10/2012

OTHER PUBLICATIONS

Syakrani N. et al, "Comparison of PUMA and CUNWRAP to 2-D Phase Unwrapping", 2011 International Conference on Electrical Engineering and Informatics, Jul. 17-19, 2011, Bandung, Indonesia, IEEE, 2011.

(Continued)

*Primary Examiner* — Delomia L Gilliard
(74) *Attorney, Agent, or Firm* — Park, Vaughan, Fleming & Dowler LLP

(57) ABSTRACT

An apparatus and method are provided for performing phase unwrapping for an acquired magnetic resonance (MR) image. The method includes modelling the MR phase in the MR image using a Markov random field (MRF) in which the true phase $\phi(t)$ and the wrapped phase $\phi(w)$ are modelled as random variables such that at voxel i of said MR image $\phi(t)(i)=\phi(w)(i)+2\pi n(i)$, where $n(i)$ is an unknown integer that needs to be estimated for each voxel i. The method further includes constructing a graph consisting of a set of vertices V and edges E and two special terminal vertices representing a source s and sink t, where there is a one-to-one correspondence between cuts on the graph and configurations of the MRF, a cut representing a partition of the vertices V into disjoint sets S and T such that s∈S and t∈T. The method further includes finding the minimum energy configuration, $E(n(i)|\phi(w))$ of the MRF on the basis that the (Continued)

total cost of a given cut represents the energy of the corresponding MRF configuration, where the cost of a cut is the sum of all edges going from S to T across the cut boundary. The method further includes using the values of n(i) in the minimum energy configuration to perform the phase unwrapping from φ(w) to φ(t) for the MR image. A confidence may be computed for each voxel using dynamic graph cuts. The unwrapped phase from two MR images acquired at different times may be used to estimate a field map from the phase difference between the two MR images. The field map may be converted into a deformation field which is then used to initialize a non-rigid image registration of the acquired MR image against a reference image. The deformation field of the non-rigid registration is controlled to be smoother where the confidence is high.

43 Claims, 6 Drawing Sheets

(51) Int. Cl.
G01R 33/56 (2006.01)
G01R 33/561 (2006.01)
G06T 5/00 (2006.01)
G06T 7/00 (2017.01)
G01R 33/24 (2006.01)

(52) U.S. Cl.
CPC . *G01R 33/56536* (2013.01); *G01R 33/56545* (2013.01); *G06K 9/00771* (2013.01); *G06T 5/002* (2013.01); *G06T 7/0014* (2013.01); *G06T 7/0024* (2013.01); *G01R 33/24* (2013.01); *G06T 2207/10088* (2013.01)

(56) References Cited

OTHER PUBLICATIONS

Bioucas-Dias J. et al, "Phase Unwrapping via Diversity and Graph Cuts", 2008 International Conference on Systems, Signals and Image Processing(IWSSIP), Jun. 25-28, 208, Bratislava, Slovakia, IEEE, 2008, pp. 495-498.
Bioucas-Dias J. et al, "Phase Unwrapping via Graph Cuts", IEEE Transactions on Image Processing, IEEE Service Center, Piscataway, NJ, US, vol. 16, No. 3, Mar. 1, 2007, pp. 698-709.
Kohli P. et al, "Measuring uncertainty in graph cut solutions", Computer Vision and Image Understanding, Academic Press, US, vol. 112, No. 1, Oct. 1, 2008, pp. 30-38.
Gholipour A et al, "On the accuracy of unwarping techniques for the correction of susceptibility-induced geometric distortion in magnetic resonance Echo-planar images", Engineering in Medicine and Biology Society, EMBC, 2011 Annual International Conference of the IEEE, IEEE, Aug. 30, 2011, pp. 6997-7000.
Irfanoglu M O e al, "Susceptibility Distortion Correction for Echo Planar Images with Non-uniform B-Spline Grid Sampling: A Diffusion Tensor Image Study", Sep. 18, 2011, Medical Image Computing and Computer-Assisted Intervention A Miccai 2011, Springer Berlin Heidelberg, Berlin, Heidelberg, pp. 174-181.
Smith S M et al, "Advances in functional and structural MR image analysis and implementation as FSL", Neuroimage, Academic Press, Orlando, FL, US, vol. 23, Jan. 1, 2004, pp. S208-S219.
Jezzard P et al, "Correction for Geometric Distortion in Echo Planar Images from Bo Field Variations", Magnetic Resonance in Medicine, Academic Press, Duluth, MN, US, vol. 34, No. 1, Jul. 1, 1995, pp. 65-73.
Li Y et al, "Geometric distortion correction for echo planar images with spatially varying scale", Magnetic Resonance Imaging, Elsevier Science, Tarrytown, NY, US, vol. 26, No. 10, Dec. 1, 2008, pp. 1388-1397.
Yeo D T B et al, "Concurrent correction of geometric distortion and motion using the map-slice-to-volume method in echo-planar imaging", Magnetic Resonance Imaging, Elsevier Science, Tarrytown, NY, US, vol. 26, No. 5, Jun. 1, 2008, pp. 703-714.
Glocker B et al, "Dense image registration through MRFs and efficient linear programming", Medical Image Analysis, Oxford University Press, Oxford, GB, vol. 12, No. 6, Dec. 1, 2008, pp. 731-741.
Xiahai Zhuang et al, "A Nonrigid Registration Framework Using Spatially Encoded Mutual Information and Free-Form Deformations", IEEE Transactions on Medical Imaging, IEEE Service Center, Piscataway, NJ, US, vol. 30, No. 10, Oct. 1, 2011, pp. 1819-1828.
Ran Tao et al, "A Variational Image-Based Approach to the Correction of Susceptibility Artifacts in the Alignment of Diffusion Weighted and Structural MRI", Jul. 5, 2009, Information Processing in Medical Imaging, Springer Berlin Heidelberg, Berlin, Heidelberg, pp. 664-675.
Ying L et al, "Unwrapping of MR Phase Images Using a Markov Random Field Model", IEEE Transactions on Medical Imaging, IEEE Service Center, Piscataway, NJ, US, vol. 25, No. 1, Jan. 1, 2006, pp. 128-136.
Ronald W.K. So et al, "Non-rigid image registration of brain magnetic resonance images using graph-cuts", Pattern Recognition, vol. 44, No. 10-11, Apr. 21, 2011, pp. 2450-2467.
Pankaj Daga et al, "Susceptibility artefact correction by combining BO field maps and non-rigid registration using graph cuts", Proceedings of SPIE, col. 8669, Mar. 13, 2013, p. 8669B.

\* cited by examiner

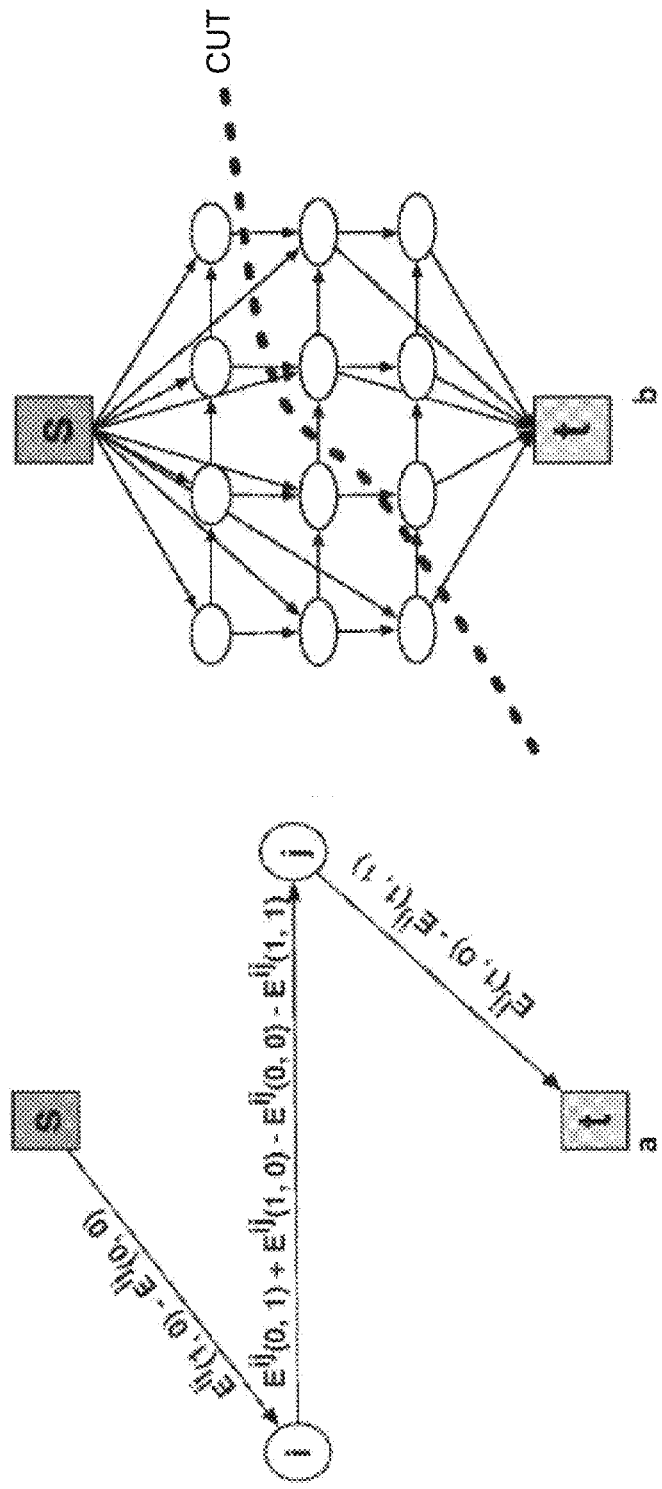

FIG. 1 Graph Construction. (a) shows the construction of the elementary graph for a single pairwise term when $E^{ij}(1,0)-E^{ij}(0,0)>0$ and $E^{ij}(1,0)-E^{ij}(1,1)>0$. Note that the graph can only have non-negative edge weights. (b) shows the building of the graph by merging the elementary graphs together. After the graph is constructed, a maximum flow algorithm can be used to find the minimum cut (denoted by the dashed green line) on the graph.

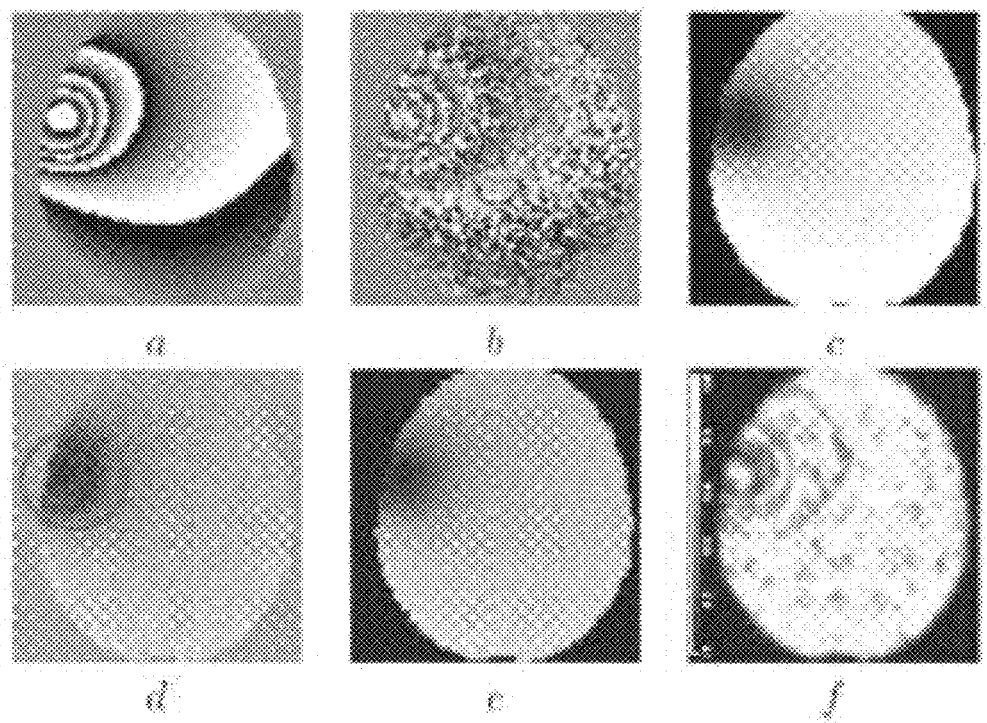

Results from phase unwrapping. (a) is a masked slice through a noise free wrapped image. (b) is the same image where the ground truth unwrapped image was corrupted with Gaussian noise. (c) shows the ground truth unwrapped image. (d) shows the unwrapping result from PRELUDE. Some areas with phase discontinuities are visible in the unwrapped result (highlighted by red circle). (e) shows the unwrapped image using the proposed phase unwrapping algorithm where no phase discontinuities are evident. (f) shows the confidence map obtained using the proposed algorithm.

FIG. 2

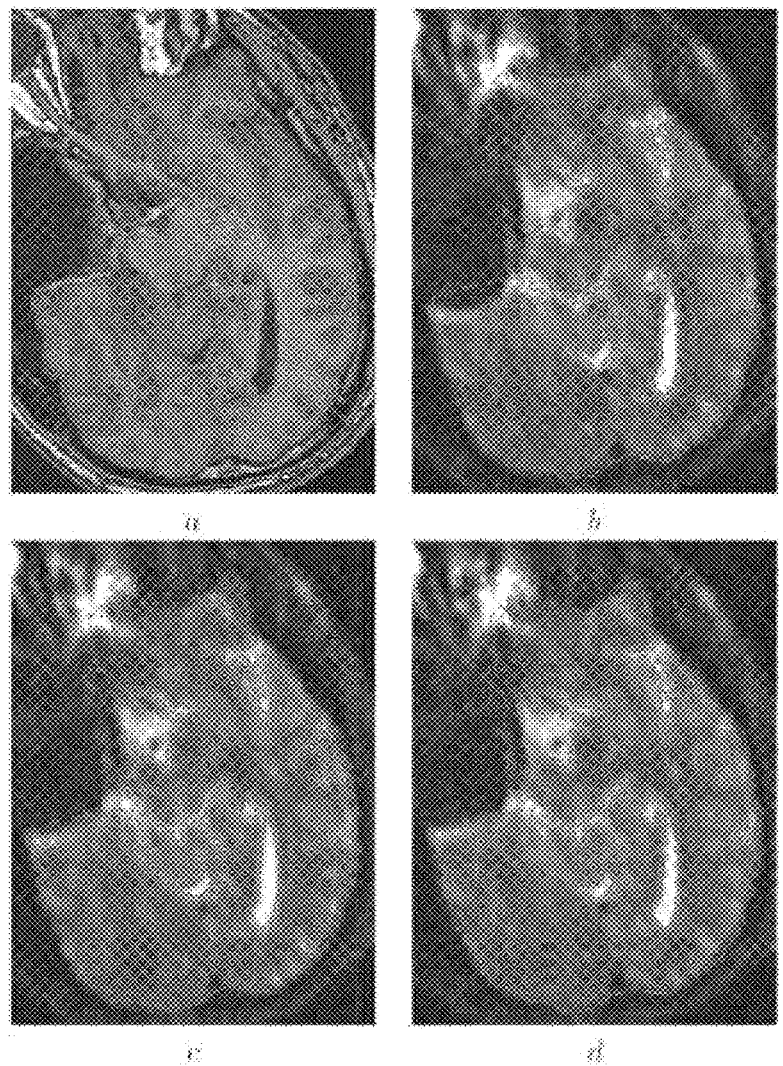

Images showing the result of correcting for susceptibility-induced spatial distortion using our algorithm. (a) shows the gold-standard high resolution T1 image acquired during surgery. (b) shows the uncorrected B0 image with a large geometric distortion around the resected area. (c) shows the result of correcting for susceptibility artefacts using the proposed field map estimation. (d) shows further improvement in the result when combined with the image registration step.

FIG. 3

| Noise Variance (rad.) | 0.08 | 0.26 | 0.52 | 0.87 | 1.0 | 1.2 |
|---|---|---|---|---|---|---|
| MCR (proposed) | 0.01 | 0.05 | 0.11 | 0.17 | 0.19 | 0.23 |
| MCR (PRELUDE) | 0.01 | 0.06 | 0.14 | 0.23 | 0.24 | 0.31 |
| Time-1 (proposed) | 5 | 5 | 6 | 8 | 8 | 9 |
| Time-2 (proposed) | 25 | 25 | 28 | 27 | 30 | 32 |
| Time (PRELUDE) | 4 | 22 | 161 | 1642 | 2532 | 4077 |

FIG. 5 Misclassification ratio (MCR) and execution time (in seconds) for generating the fieldmap from the synthetic phase images. The MCR is defined as the ratio between the voxels that were incorrectly wrapped to the total number of voxels. For small amounts of phase noise (noted in radians), both the proposed phase unwrapping algorithm and PRELUDE perform similarly. However, for larger noise levels, the proposed algorithm results in lower MCR. The execution time of PRELUDE for high levels of phase noise does not satisfy the stringent time requirements of neurosurgery, while the proposed algorithm executes well within the time constraints. Time-1 refers to the time taken by the proposed method to do phase unwrapping without confidence map estimation. Time-2 is for phase unwrapping along with uncertainty estimation.

| | Initial | PRELUDE | Fieldmap only | Reg. only | Proposed |
|---|---|---|---|---|---|
| | 3.08 (1.94) | 1.92(1.14) | 1.51(1.23) | 1.31(0.97) | 1.23(0.84) |
| | 2.94(1.89) | 1.51(1.42) | 1.48(1.35) | 1.14(0.87) | 1.12(0.73) |
| | 2.97(3.56) | 1.94(2.26) | 1.94(2.26) | 1.98(1.56) | 1.03(1.21) |
| | 3.40(3.17) | 2.71(1.54) | 2.42(1.06) | 2.51(1.99) | 2.34(0.98) |
| | 1.76(1.42) | 1.43(1.36) | 1.38(1.11) | 1.12(0.78) | 1.08(0.81) |
| | 2.27(2.30) | 1.23(1.08) | 1.36(1.02) | 1.68(1.54) | 1.22(1.12) |
| | 3.85(3.91) | 2.78(2.51) | 2.42(2.02) | 2.53(1.91) | 2.39(1.62) |
| | 2.70(2.37) | 2.12(1.43) | 2.04(1.51) | 2.04(1.63) | 1.72(1.43) |
| | 3.60(3.51) | 2.53(2.01) | 2.19(1.84) | 2.61(2.30) | 1.81(0.93) |
| | 2.32(1.85) | 1.32(1.01) | 1.45(1.04) | 1.76(1.34) | 1.41(0.96) |
| | 2.17(2.11) | 1.16(0.86) | 1.120(.72) | 1.47(1.14) | 1.07(0.93) |
| | 2.81(2.62) | 1.93(1.62) | 1.59(1.22) | 2.12(1.69) | 1.41(1.04) |
| | 2.02(2.17) | 1.16(0.91) | 1.07(0.86) | 1.41(1.38) | 1.01(0.92) |

FIG. 6 Mean(standard deviation) of the sum of square errors for diffusion tensor fitting in interventionally acquired diffusion weighted images for thirteen patients. The first column (Initial) shows the initial mean error. The second column (PRELUDE) shows the fit errors after correcting for susceptibility artefacts using PRELUDE. The third column (Fieldmap only) shows the tensor fit errors after correcting for susceptibility artefacts using the fieldmap generated after unwrapping the phase maps using the proposed phase unwrapping algorithm. The fourth columns (Reg. only) shows the tensor fit errors after correcting for susceptibility artefacts using the proposed registration algorithm. The final column (Proposed) shows the tensor fit errors after combining the fieldmap and image registration methods using the pro- posed method. The proposed method showed statistically significant improvement over the other methods (p-value < 10−3).

APPARATUS AND METHOD FOR CORRECTING SUSCEPTIBILITY ARTEFACTS IN A MAGNETIC RESONANCE IMAGE

FIELD OF THE INVENTION

The present invention relates to an apparatus and method for correcting susceptibility artefacts in magnetic resonance (MR) imaging, and to an apparatus and method for performing phase unwrapping of an MR image for use in such corrections.

BACKGROUND OF THE INVENTION

1. Introduction

Magnetic resonance imaging (MRI) is widely used in medicine and other applications for performing three-dimensional imaging, for example of a human body (or part of a human body). In some cases, the MRI imaging may be performed in real-time to provide real-time (dynamic) visual feedback to a surgeon during a medical procedure, such as neuro-surgery.

It is well-known that certain forms of MRI, such as echo planar imaging (EPI) are subject to susceptibility artefacts, inaccuracies in intensity and geometry caused by inhomogeneities in the magnetic field (sometimes referred to as $B_0$ inhomogeneities). Such inhomogeneities may arise at the transition between two forms of matter having different magnetic properties (magnetic susceptibility), for example at the transition between the brain and surrounding air or bone. These inaccuracies can result in anatomical features being incorrectly located in an image, in other words, the positions of such features may be distorted from their true locations. This distortion can be very significant, for example, in real-time MRI imaging for image-guided surgery, where it is extremely important to know the precise location of a medical instrument in respect to the different anatomical features—otherwise (for example) a treatment may be applied to the wrong location, or the medical instrument may inadvertently damage some other component of the body.

Existing techniques for addressing the problem of $B_0$ inhomogeneities are generally divided into two categories. A first category is based in effect on image analysis, without consideration of the underlying physics. In this category, it is assumed that a prior image of the relevant region of the body is available which does not suffer from $B_0$ inhomogeneities—such an image will therefore be undistorted. Such an undistorted image can be obtained from various MRI imaging techniques, for example, T1 images. A registration or mapping is then produced based on identifying features in the (potentially) distorted image with similar looking features in the undistorted image. This then allows the distorted image to be warped or transformed to coincide in positional terms with the undistorted image. In other words, a given feature (X) in the distorted image is identified with the same feature (X') in the undistorted image. The distorted image is then transformed (un-distorted) so that X now becomes coincident with (or at least close to) X'. This new positioning is assumed to represent the correct (true) location of the anatomical feature corresponding to X. One drawback with this image intensity mapping is that it relies upon the image containing sharp (distinct), well-identified features. However, if no (or only a few) such features are present in the image, for example, the image appears rather homogenous, then it is difficult to perform the desired registration and subsequent transformation. A further drawback is that this method relies upon the availability of an existing undistorted image.

A second category of technique for addressing the problem of $B_0$ inhomogeneities is more physics-based, in that it tries to calculate the actual distortions arising from the $B_0$ inhomogeneities, and then to remove (cancel out) these distortions. A MRI signal strength at any given can be represented as a complex quantity $S=ke^{(i\theta)}$, where k is the absolute magnitude or intensity of the signal, and $\theta$ is the phase. Although most MRI imaging is based on the intensity k, it is known to use the phase $\theta$ to generate a field map, which can then be used to remove from the image distortions arising from the $B_0$ inhomogeneities. One difficulty with this approach is that the generating the field map uses the absolute or total phase, $\theta_T$, whereas the MRI imaging only produces a residual phase $\theta_R$, where $\theta_R=\theta_T$ modulo($2\pi$). In other words, $\theta_T=\theta_R+N\cdot 2\pi$, where N is an integer that varies from one location to another. Accordingly, this approach tries to perform a phase "unwrapping" process, in effect, to determine the value of N across the image, which then allows the total phase $\theta_T$ to be determined from the residual phase $\theta_R$. Once the total phase has been obtained, the field map and hence the $B_0$ inhomogeneities can be determined, and the image undistorted as appropriate.

Some known systems use a combination of both the first (image-based) and second (filed map-based) techniques. For example, [14] describes an approach in which a field map-based technique is used first to undistort an acquired image, and the undistorted image produced in this manner is then registered, using an intensity based approach, to an earlier (prior) image which was obtained without distortion. Although such an approach has been reasonably effective, the computational demands tend to be high, which means that it is difficult to support real-time image-assisted surgery (for example). Moreover, it continues to be desirable to remove distortion due to $B_0$ inhomogeneities from MRI images as accurately as possible.

2. Review of Some Existing Work

Echo planar imaging (EPI) provides high temporal resolution and is routinely used in functional magnetic resonance imaging (fMRI) and diffusion weighted imaging (DWI) sequences. In recent years, interventional MRI (iMRI) is fast emerging as the preferred imaging choice for image-guided neurosurgery. The relatively high spatial resolution, excellent soft tissue contrast and the lack of ionizing radiation makes iMRI an attractive imaging option for image-guided interventions. Furthermore, along with conventional structural imaging, current commercial iMRI scanners can also perform diffusion and functional imaging which allows for imaging of eloquent brain areas and critical white matter tracts along with the surgical target areas. Modern interventional MRI scanners use EPI sequences to acquire DWI images during neurosurgery, which can be then used for localisation of critical white matter tracts that lie close to the area of intervention. EPI performs fast imaging by sampling the entire frequency space of the selected slice with one excitation pulse and fast gradient blipping. However, this results in very low bandwidth in the phase encoding direction, which makes EPI images highly susceptible to small perturbations of the magnetic field, giving rise to various artefacts arising due to magnetic field inhomogeneities. The primary source of these so-called susceptibility artefacts is the difference in magnetic susceptibility between various tissues being imaged. In the context of neuroimaging, this leads to severe geometric and intensity distortions in areas like the brain stem, frontal and temporal lobes. The distortions are especially severe as the surgically resected cavity contains air and induces high susceptibility differences leading to large distortions around the area of resection. Recent works have shown that diffusion weighted MRI images along with structural images could more accurately localise brain structures of interest during neurosurgical procedures [1], [2]. There is also an interest in performing tractography on interventional DWI images to segment white matter structures of interest [3]-[5]. Hence, it is important to accurately compensate for susceptibility artefacts to be able to use EPI images for effective neuronavigation.

Correction of susceptibility induced distortions in EPI images falls under two broad categories: field map estimation and non-linear image registration. The field map estimation approach is the estimation of $B_0$ magnetic field inhomogeneity at every voxel from phase images acquired at different echo times as shown in [6]-[8]. It was shown in [9] that correction of susceptibility artefacts by field maps is not entirely accurate in regions of high field inhomogeneity. This is especially critical when correcting EPI images that are acquired using interventional MRI during a neurosurgical procedure. The area of resection often lies in close proximity to critical white matter tracts and as the neurosurgical procedure progresses, information on the exact location of the tract is beneficial for surgical outcome. However it is exactly at the resection margin with the brain/air interface that the $B_0$ magnetic field is most inhomogeneous and produces maximum geometric and intensity distortions.

A popular alternative to field maps is to use intensity based non-rigid image registration techniques to register the distorted EPI image to a high resolution undistorted T1-weighted MRI [10]-[13]. However, the EPI images acquired interventionally have low signal-to-noise ratio and suffer from various artefacts which makes intensity based image registration challenging. A recent work [14], an extension of [15], proposed generation of field map estimates from structural images, which was then used to sample a non-uniform B-spline grid for an elastic registration based correction step. However, this work is difficult to apply in the interventional setting due to the complex physical environment around the resection area and the need for tissue segmentation maps. Registration based approaches which require acquisition of an additional EPI image have also been proposed [16], [17]. However, these approaches add to the scan time during neurosurgery.

SUMMARY OF THE INVENTION

The invention is defined in the appended claims.

One aspect of the invention provides a method of performing phase unwrapping for an acquired magnetic resonance (MR) image comprising:

modelling the MR phase in the MR image using a Markov random field (MRF) in which the true phase $\phi(t)$ and the wrapped phase $\phi(w)$ are modelled as random variables such that at voxel i of said MR image $\phi(t)(i)=\phi(w)(i)+2\pi n(i)$, where n(i) is an unknown integer that needs to be estimated for each voxel i;

constructing a graph consisting of a set of vertices V and edges E and two special terminal vertices representing a source s and sink t, where there is a one-to-one correspondence between cuts on the graph and configurations of the MRF, a cut representing a partition of the vertices V into disjoint sets S and T such that s∈S and t∈T;

finding the minimum energy configuration, $E(n(i)|\phi(w))$ of the MRF on the basis that the total cost of a given cut represents the energy of the corresponding MRF configuration, where the cost of a cut is the sum of all edges going from S to T across the cut boundary; and using the values of n(i) in the minimum energy configuration to perform the phase unwrapping from $\phi(w)$ to $\phi(t)$ for the MR image.

In some embodiments, the MR phase is modelled as a piecewise smooth function where the smooth component is due to the inhomogeneities in the static MR field and the non-smooth component arises due to changes in magnetic susceptibility from one tissue type to another. The spatial smoothness may be enforced by modelling the true phase as the MRF and a smoothness model is incorporated by using a potential function. The true phase may be modelled as a six-neighbourhood pairwise MRF where a convex pairwise potential function is defined between immediately adjacent neighbouring voxels. The convex pairwise potential function may be sum of squared differences. A variety of other metrics could be used to enforce spatial smoothness.

In some embodiments, the method further comprises weighting voxel contributions on the basis that phase measurements in low signal areas of the MR image tend to be less reliable. Accordingly, phase measurements in high signal areas of the MR image are assigned a higher weight that phase measurements in low signal areas of the MR image. The weight assigned to a given voxel may be determined from the probability that the contribution of noise to the phase of a given voxel is less than £ radians, where £ is set to be a small value greater than zero. A region in the MR image containing only air may be used to determine the noise variance of the MR image, wherein said noise variance is then used for determining the weight to be assigned to a given voxel. A variety of other techniques could be used for weighting based on signal strength.

In some embodiments, a confidence estimation is performed at each voxel for the phase unwrapping. The confidence associated with a given label for a random variable may be estimated as the ratio of the min-marginal energy associated with that labelling to the sum of the min-marginal energies for that random variable for all possible labels, wherein the min-marginal is the minimum energy obtained when a random variable is constrained to take a certain label and the minimisation is performed over all remaining variables. The confidence may be computed for each voxel using dynamic graph cuts. Using dynamic graph cuts in this manner generally comprises constraining a given MRF node to belong to the source or sink by adding an infinite capacity edge between the given MRF node and the respective terminal node, and computing the min-marginal energies by optimizing the resulting MRF. A variety of other techniques could be used for obtaining a confidence associated with the phase unwrapping.

In some embodiments, the method further comprises using the unwrapped phase from two MR images or the unwrapped phase difference between the two MR images to estimate a field map. The field map converted into a deformation field (also referred to as a displacement field), which may in turn be used to initialise a non-rigid image registration of the acquired MR image against a reference image. The deformation field for performing the non-rigid image registration may be parameterised using cubic B-splines, where the B-splines are constrained to move only in the phase encode direction. A similarity measure used for the non-rigid image registration is based on local information which encodes spatial context by varying the contribution of voxels according to their spatial coordinates. The non-rigid image registration may be represented as a discrete set of displacements in the phase encode direction, and the non-rigid image registration is modelled as a first-order Markov random field. The first derivative of the deformation field for the non-rigid image registration may be penalised to ensure a smooth transformation. A variety of other techniques could be used for performing the non-rigid image registration.

Assuming that confidence values are available from the phase unwrapping, a penalty term for penalising the first derivative of the deformation field in the non-rigid image registration may be modulated by the confidence computed for each voxel, such that the penalty weight is higher in regions of high confidence than in regions of low confidence. A variety of other techniques could be used for incorporating the confidence values from the field map into the image registration procedure.

One significant benefit of using graph cuts for the phase unwrapping is that they can be performed much more quickly than many existing techniques. This facilitates the use of the present approach in intra-operative procedures, such as image-assisted surgery. Furthermore, because a confidence level can be assigned to different portions of the field map, and this confidence level can then be taken into account for a subsequent image registration procedure, this can help to improve the overall results in terms of the correction of susceptibility artefacts for MR images.

Another aspect of the invention provides a method for correcting susceptibility artefacts in an acquired magnetic resonance image comprising the steps of:

performing phase unwrapping for an acquired magnetic resonance (MR) image, including computing a confidence for the phase unwrapping for each voxel of the acquired MR image;

generating a field map for the acquired magnetic resonance image from the unwrapped phase;

converting the field map to a deformation field; and using the deformation field to initialise a non-rigid image registration of the acquired MR image against a reference image, wherein the deformation field of the non-rigid registration is controlled to be smoother where said confidence is high.

(The confidence may also be used for the initialisation of the non-image registration).

In some embodiments, performing phase unwrapping may involve the use of graph cuts as described above. However, other methods, such as a Monte Carlo Markov chain (MCMC), can also be used to perform the phase unwrapping and to obtain an associated confidence level (although such other methods will typically be slower than graph cuts). Likewise, generating the field map from the unwrapped phase, and using the field map to initialise a non-rigid image registration may also be performed as described above, although a variety of other techniques could be used for these activities. For example, phase unwrapping and/or field map estimation may be performed using methods like, but not limited to, Expectation Propagation, Variational Bayes, Markov Chain Monte Carlo (MCMC) and Hamiltonian MCMC simulations. Such method characterise the posterior distribution over the estimation parameters given the measured phase images, and can all be used to estimate the confidence associated with the phase unwrapping and/or the estimated field map.

In some implementations, a per voxel confidence of the phase unwrapping is computed. The generation of the field map then includes computing a confidence for each voxel of the field map using the confidence from the phase unwrapping, plus an estimate of uncertainty in the image (which may be determined, for example, using one of the above techniques). In other words, the resulting confidence for the field map is high where the confidence in the phase unwrapping is high, but lowered if there is high image uncertainty for the relevant voxel. The resulting confidence for the field map can then be used to control the smoothness of the deformation field. Such an approach can therefore be regarded as controlling the smoothness of the deformation field based on the confidence from the phase unwrapping, but also feeding in an estimate of image uncertainty for the field map to provide an further or enhanced control of smoothness.

Another aspect of the invention provides an apparatus for implementing any method described above. In some cases, the apparatus may comprise a general purpose computer system having one or more processors that executes computer program code which instruct the computer system to perform the specified method. Such computer program code can be supplied on a non-transitory medium, such as an optical disk, flash memory, over a network from a hard disk drive, and so on. In some cases, the apparatus may have at least some specialised hardware, such as one or more graphical processing units (GPUs) for executing computer program code to perform at least some of the method. In some cases the apparatus may be linked to or integrated into an MR image acquisition and/or analysis system, for example to support, diffusion weighted and functional MRI, as well as image-assisted or image-guided surgery.

In some embodiments, the approach described herein combines field map and image registration based correction approach in a unified scheme. A phase unwrapping algorithm based on graph cuts can associate an uncertainty measure with the estimated field map. The deformation field generated from the field map correction step and the associated confidence (uncertainty) measure are used to initialize and adaptively guide a subsequent image registration step. Some embodiments of this approach therefore include: a phase unwrapping algorithm using dynamic graph cuts that also determines the uncertainty associated with estimated solution; and a registration algorithm that can be adaptively driven using the confidence map estimated from the phase unwrapping step to refine the results in low confidence areas. The approach described herein may be used, for example, to correct susceptibility artefacts in interventionally acquired echo planar imaging (EPI) images during neurosurgery.

More generally, echo planar imaging is routinely used in diffusion weighted and functional MRI due to its rapid acquisition time. However, the long readout period makes it prone to geometric and intensity distortions, collectively termed susceptibility artefacts. The use of these distorted images hampers the effectiveness of image-guided surgery systems as critical white matter tracts and functionally eloquent brain areas cannot be accurately localised. The approach described herein provides, in some embodiments, a method for the correction of distortions arising from susceptibility artefacts in echo-planar MRI images that combines field map and image registration based correction techniques in a unified framework. In some embodiments, a phase unwrapping algorithm is utilised that can efficiently compute the $B_0$ magnetic field inhomogeneity map as well as the uncertainty associated with the estimated solution through the use of dynamic graph cuts. This information may then used to adaptively drive a subsequent image registration step to further refine the results in areas with high uncertainty. The effectiveness of the unified algorithm described herein in correcting for geometric distortions due to susceptibility artefacts is illustrated on interventionally acquired echo planar MRI images, as discussed in more detail below.

Accordingly, the approach described herein helps to correct robustly and accurately for the geometric and intensity distortions in echo planar MRI images through field maps and image registration techniques. Field maps are prone to be noisy, especially at the interface of issue boundaries with different magnetic susceptibilities. Dynamic graph cuts may be used to find the most likely field map and uncertainty information associated with the generation of the field map. This estimated uncertainty associated with the generation of the field map may be used for a subsequent image registration step that is selectively driven in regions of high uncertainty. This approach supports an efficient computational implementation and is suitable for use in situations where (near) real-time susceptibility correction is required, such as for MR images acquired during a neuro-surgical procedure to support surgical navigation.

Accordingly, the approach described herein can be used to employ two complementary techniques to correct more accurately for susceptibility artefacts in EPI imaging. The initialisation from the field map based deformation, taken confidence into account, helps to produce a more accurate deformation field to correct for distortions. This approach could be utilised, for example, in any image processing pipeline that used EPI based MR images for analysis (EPI is the most frequently used acquisition for diffusion and functional MRI). This approach could also be utilised, for example, in an image-guided neurosurgery setting in which EPI images are acquired pre- and intra-operatively to locate white matter tracks. Without correct, the localisation can be quite inaccurate, especially around areas of tissue resection. Correcting for the susceptibility artefacts as described herein can help to lead to more accurate navigation during neurosurgery.

BRIEF DESCRIPTION OF THE DRAWINGS

Various embodiments of the invention will now be described by way of example only with reference to the following drawings:

FIG. 1 is a schematic illustration depicting a graph having a source node s and a sink node t, linked by a set of intervening vertices and edges, and with a cut through the graph to partition the nodes into two regions, one including the source node s, and the other including the sink node t;

FIG. 2 presents some results obtained by phase unwrapping simulated data, and compares the approach described herein against phase unwrapping using a known technique and against a known (ground truth) image;

FIG. 2 presents some results obtained by phase unwrapping simulated data, and compares the approach described herein against phase unwrapping using a known technique and against a known (ground truth) image;

FIG. 3 presents some results obtained by correcting susceptibility artefacts in a magnetic image using the approach described herein in comparison with using a known technique;

FIG. 5 presents some timing results for obtaining the results of FIG. 2; and FIG. 6 presents some data representing residual errors in tensor fits associated with the results presented in FIG. 3.

DETAILED DESCRIPTION

1. Methods

A. Phase Modelling

Figure 4:
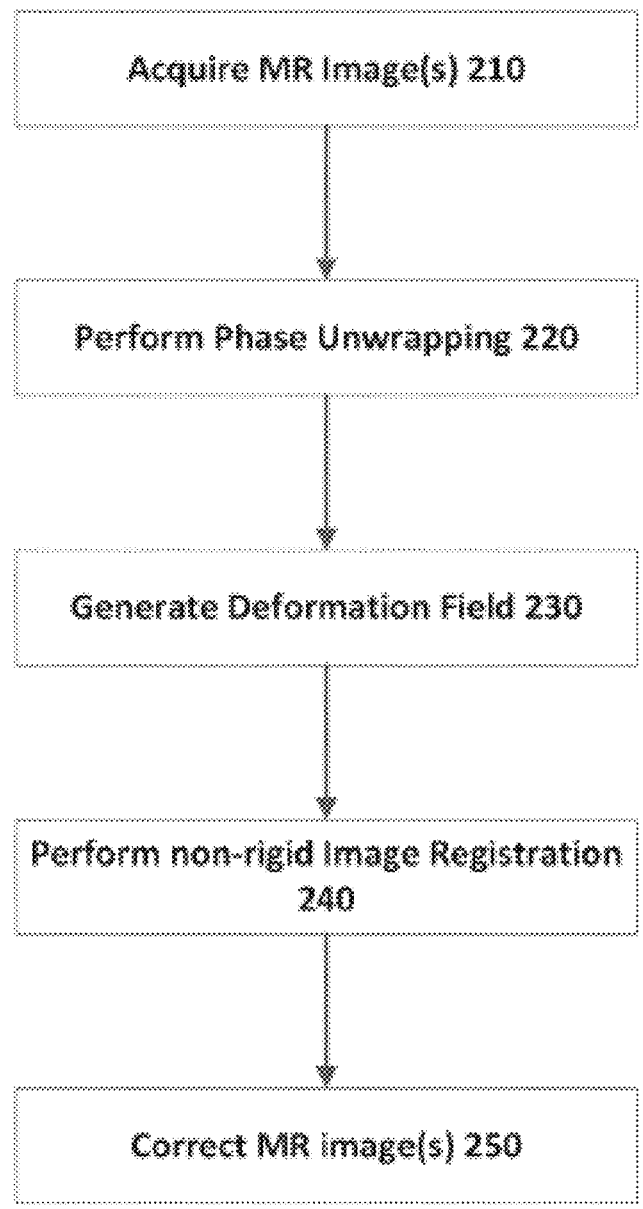
FIG. 4 is a high-level flowchart that provides an overview of processing according to one embodiment of the invention.

A known method for estimating the field map is to use the phase difference between two MR images acquired at different echo times. However, the phase images are uniquely defined only in the range of $(-\pi, \pi]$ and hence the phase images need to be unwrapped at each voxel by an unknown integer multiple of $2\pi$ to obtain the true phase as in eq. (1).

$$\phi_t(i) = \phi_w(i) + 2\pi n_i \quad (1)$$

where $\phi_t(i)$ is the true phase at a given voxel i, $\phi_w(i)$ is the wrapped phase and n is the unknown integer multiple of $2\pi$ that needs to be estimated. Phase unwrapping is an ill-posed problem and becomes intractable without regularization.

Similar to [18], the phase unwrapping method can be modelled as a Markov Random Field (MRF) where the true phase $\phi(t)$ and the wrapped phase $\phi(w)$ are modelled as random variables. We aim to find the discrete label set n(i) that gives the maximum a posteriori (MAP) estimate of the phase wraps:

$$\phi_t(i) = \max \underbrace{P(\phi_w \mid \phi_t) P(\phi_t)}_{\text{Likelihood} \quad \text{Prior}} \quad (2)$$

The likelihood term in eqn. (2) is modelled as $\delta((\phi(w)-W(\phi(t)))$, where $\delta$ is the delta function and $W(\phi(t))$ is the wrapped true phase. This problem is ill-posed and additional constraints on the true phase are incorporated in terms of prior probabilities.

The MR phase can usually be modelled as a piecewise smooth function where the smooth component is due to the inhomogeneities in the static MR field and the non-smooth component arises due to changes in the magnetic susceptibility from one tissue type to another. The spatial smoothness is enforced by modelling the true phase as a MRF and incorporating the smoothness model through a suitable potential function. In this work, we model the true phase as a six-neighbourhood pairwise MRF where the pairwise potential function used is the sum of square of difference between adjacent neighbours. Owing to the MRF-Gibbs equivalence [19], the phase unwrapping problem is to find the MRF labelling or configuration that minimises the energy $E(k|\phi(w))$:

$$E(k \mid \phi_w) = \operatorname*{argmin}_{n} \sum_{i \in I} \sum_{s \in N} V(\Delta \phi_t) \quad (3)$$

where I are the image voxels, N is the set of neighbours for a given voxel at i, and $V(\Delta\phi_1)$ is a convex potential function defined on the difference potential between a voxel at i and each neighbour (s) in N. The unknown integer wraps are denoted by k.

B. Energy Minimization Via Graph Cuts

As described herein, graph cuts are used for finding the minimum energy configuration of an MRF by constructing a graph where there is one-to-one correspondence between the cuts on the graph and configurations of the MRF. Additionally, the total cost of a given cut should represent the energy of the corresponding MRF configuration. Hence, the task of finding the minimum energy configuration of the MRF in eqn. (3) is equivalent to finding the cut on the representative graph with the minimum cost. The minimum cost cut can be efficiently found by using the maximum flow algorithm [22].

Graph cuts have previously been used as a method for optimization of multi-label problems [20], [21]. A graph $G=(V, E)$ consists of a set of vertices V and edges E and two special terminal vertices termed source s and sink t. A cut on such a graph is a partition of the vertices V into disjoint sets S and T such that $s \in S$ and $t \in T$. The cost of the cut is then the sum of all edges going from S to T across the cut boundary. It is shown in [21] that an energy function with the form of eq. (4) is graph representable as long as each pair-wise term $E^{ij}$ satisfies the inequality in eq. (5). The energy function disclosed herein has the structure of eq. (4) with a null unary data term.

$$E(x_1, x_2, \ldots x_u) = \sum_{i=1}^{u} E^i(x_i) + \sum_{i=1; i<j}^{u} E^{ij}(x_i, x_j) \quad (4)$$

$$E^{ij}(0, 0) + E^{ij}(1, 1) \leq E^{ij}(0, 1) + E^{ij}(1, 0) \quad (5)$$

We now proceed to show that the pair-wise terms in our energy function satisfy the required inequality constraint. If the pairwise energy term V is convex and if the minimum of $E(k|\phi(w))$ is not reached, there exists a binary image such that $\delta \in (0, 1)$ and $E(k+\delta|\phi_w) < E(k|\phi_w)$. Assuming a two neighbourhood MRF system for the sake of brevity, let $K_{t+1} = K_t + \delta^i$ be the wrap count at time t+1 at voxel i. Then, we have eq. (6) where $\Delta \phi_t$ is the difference in the true phase between the MRF neighbours.

$$\Delta \phi_t = 2\pi (k_{t+1}^i - k_{t+1}^{i-1}) + (\phi_w^i - \phi_w^{i-1}) \quad (6)$$

After simple algebraic manipulation of eq. (6), we can rewrite the energy function as eq. (7).

$$E(k^t + \delta | \phi_w) = \quad (7)$$
$$\operatorname*{argmin}_{n} \sum_{i \in I} \sum_{s \in N} V(2\pi(\delta^i - \delta^{i-1}) + 2\pi(k_t^i - k_t^{i-1}) + (\phi_w^i - \phi_w^{i-1}))$$

Now considering the terms in eq. (5), we have:

$E(0,0) = V(t)$ $E(1,1) = V(t)$ $E(0,1) = V(2\pi + t)$ $E(0,1) = V(-2\pi + t)$ where $t = 2\pi(k_t^i - k_t^{i-1}) + (\phi_w^i - \phi_w^{i-1})$ We can now see that $E_{ij}(0, 0) + E_{ij}(1, 1) \leq E_{ij}(0, 1) + E_{ij}(1, 0)$ or $V(2\pi+t) + V(-2\pi+t) \geq 2 \times V(t)$ as V is convex. Hence, the proposed energy term can be represented by a graph.

FIG. 1(a) shows how an elementary graph between two MRF neighbours is constructed when $E_{ij}(1,0) - E_{ij}(0,0) > 0$ and $E_{ij}(1,0) - E_{ij}(1,1) > 0$. Similar constructions exist for other cases, and we refer the reader to [21] for more details. The complete graph is built by merging the elementary graphs for each node pair as illustrated in FIG. 1(b). After the complete graph is built, the minimum cut on it can be found by pushing the maximum flow between the source and sink. FIG. 1(c) illustrates that at each binary optimization step, the confidence value can be calculated with each labelling. For example, the confidence of being in state (1) after two binary optimizations is given by $\sigma^1(0,0) \times \sigma^2(0,1) + \sigma^1(0,1) \times \sigma^2(1,1)$.

C. Weighting Voxel Contributions

A quality map can be integrated into this optimization scheme to increase its robustness. Phase measurements in low signal areas tend to be less reliable and these areas can be discounted by assigning a weight to each voxel based on its magnitude. Similar to [23], the weight $w_v$ at a voxel v is given by eq. (8) where |p| is the voxel magnitude, $\epsilon$ is a small value greater than zero and erf is the error function. The noise variance $\sigma$ is computed using a manually selected region of interest in the phase image containing only air.

$$w_v = \operatorname{erf}\left(\frac{|p|\tan\epsilon}{\sigma\sqrt{2}}\right) \quad (8)$$

Equation (8) can be interpreted as the probability that the contribution of noise was less than $\epsilon$ radians to the phase of a given voxel v.

D. Confidence Estimation in Phase Unwrapping

It is shown in [24] that the uncertainty associated with the MAP solution can be estimated using Graph Cuts through computation of max-marginals. Max-marginals are a general notion and can be defined for any function as eq. (9). Hence, the max-marginal is the maximum probability over all MRF configurations where an MRF site $x_v$ is constrained to take the label j ($x_v = j$).

$$\mu_{v;j} = \max_{x \in L, x_v = j} Pr(x) \quad (9)$$

The max-marginals can be used to compute the confidence measure associated with any random variable labelling as eq. (10):

$$\sigma_{v;j} = \frac{\max_{x \in L, x_v = j} Pr(x)}{\sum_{k \in L} \max_{x \in L, x_v = k} Pr(x)} = \frac{\mu_{v;j}}{\sum_{k \in L} \mu_{v;k}} \quad (10)$$

Hence, the confidence $\sigma_{v;j}$ for a random variable $x_v$ to take the label j is given by the ratio of the max-marginal associated with assigning label j to variable $x_v$ to the sum of max-marginals for all possible label assignments for the variable $x_v$. As shown in [24], this confidence can be expressed in terms of min-marginal energies, where a min-marginal is the minimum energy obtained when we constrain a random variable to take a certain label and minimise over all the remaining variables as in eq. (11):

$$\psi_{v;j} = \operatorname*{argmin}_{x \in L, x_v = j} E(x) \quad (11)$$

By leveraging the MRF-Gibbs equivalence, the confidence measure can be expressed in terms of the min-marginals as eq. (12). Hence, the confidence associated with a given label for a random variable is the ratio of the min-marginal energy associated with that labelling to the sum of min-marginal energies for that variable for all possible labels. We refer the reader to [24] for further details.

$$\sigma_{v;j} = \frac{\exp(-\psi_{v;j})}{\sum_{l \in L} \exp(-\psi_{v;l})} \qquad (12)$$

Dynamic graph cuts can be used to compute $\sigma_{v;j}$ for each voxel at every binary optimization step in a very efficient manner. A given MRF node can be constrained to belong to the source or the sink by adding an infinite capacity edge between it and the respective terminal node. No other changes need to be made to the graph and the required min-marginal can be computed by optimizing the resulting MRF. Hence, to compute the min-marginals at every binary optimisation step, one has to optimise one such MRF for every node v and each of the two labels. Usually these MRFs are very close to each other and form a slowly varying dynamic MRF system, so that the search trees from previous computations can be efficiently reused, which greatly reduces the computation time.

E. Image Registration Framework

The displacement field and the confidence map generated from the phase unwrapping step are used to initialize the subsequent non-rigid registration step. The registration algorithm follows closely from [25], [26] and is formulated as a discrete multi-labelling problem. The deformation field is parameterised using cubic B-splines [27] and a local variant of the normalized mutual information (SEMI) as described by Zhuang et al. [28] is used as the similarity measure. SEMI is a local information measure and encodes the spatial context by varying the contribution of the voxels according to their spatial coordinates. Under this scheme, the joint histogram is computed as shown in eq. (13), where $I_r(x)$ and $I_f(x)$ are the reference and transformed floating images, $w_r$ and $w_f$ are Parzen windows functions, and the joint histogram is calculated for the local region $\omega_s$. In addition, $W_s(x)$ is a weighting function for the spatial encoding and is a Gaussian kernel centered on the control point.

Normalized mutual information [29] is computed for each of the local regions from these joint histograms. The local nature of the similarity measure allows the problem to be formulated in the MRF framework and can be solved using the graph cuts framework.

$$H_s(r, f) = \sum_{x \in \omega_s} (w_r I_r(x) w_f I_f(x)) W_s(x) \qquad (13)$$

The geometric distortion due to susceptibility is dominant in the phase encode (PE) direction; hence the B-spline control points are constrained to move only in the PE direction. We consider a discrete set of displacements in the PE direction and a label assignment to a control point is associated with displacing the control point by the corresponding displacement vector. This allows us to formulate the registration as a discrete multilabel problem modeled in the first-order MRF, where the B-spline control points are the random variables (MRF nodes) and the goal is to assign individual displacement values to these nodes. Additionally, we penalize the first derivative of the displacement field to ensure a smooth transformation. This regularization can be represented as the pairwise binary terms, whereas the similarity measure can be represented as the unary term.

We modulate the weight of the penalty term by the confidence map obtained during the phase unwrapping step. In regions of high confidence, we keep the relative weight of the penalty term high whereas we relax it in areas with low confidence to allow for more displacement. Hence, a spatially varying cost function takes the form of eqn. (14) where $\sigma_i$ is the confidence at voxel i and $P_i$ is the global penalty term weight and $\|d\|$ is the norm of the displacement between neighbouring control points. The penalty term weights are initialized by projecting the confidence map onto the control point grid. This cost function is optimised using an alpha-expansion variant of the graph cuts minimisation algorithm [20].

$$C = \sum_{i \in I} ((1 - \sigma_i \times P_i) \times SEMI_i - (\sigma_i \times P_i \times \|d\|)) \qquad (14)$$

2. Validation

Validation Using Simulated Data

We have validated the phase unwrapping algorithm using simulated phase MRI data. To conduct the simulations, an MRI simulator software package was used: POSSUM (Physics Oriented Simulated Scanner for Understanding MRI) [30], [31]. The algorithm solves fundamental Bloch equations to model the behaviour of the magnetisation vector for each voxel of the brain and for each tissue type independently. The signal coming from one voxel is obtained by analytical integration of magnetisation over its spatial extent, and the total signal is formed by numerically summing the contributions from all the voxels. For a given brain phantom, pulse sequence and magnetic field values, POSSUM generates realistic MR images. Magnetic field values are calculated by solving Maxwell's equations which as an input use an air-tissue segmentation of the brain, and their respective susceptibility values. These magnetic field values are fed into the Bloch equation solver in POSSUM, resulting in images with extremely realistic susceptibility artefacts. A further, in-depth, description of POSSUM is presented in [30].

Here we use a 3D digital brain phantom from the MNI BrainWeb database, which is very thoroughly segmented into various tissues such as grey and white matter, cerebrospinal fluid (CSF), and with a very good air-tissue segmentation [32]. We assume a 1.5 T scanner, and use appropriate MR parameter values for white matter T1=833 ms, T2=83 ms, spin density rho=0.86; grey matter T1=500 ms, T2=70 ms, rho=0.77 and CSF T1=2569 ms, T2=329 ms and rho=1. A typical field map sequence was acquired: two gradient echo images with different echo times (TE1=8 ms, TE2=10 ms). Spatial resolution was 2×2×2 mm and TR=700 ms.

In order to make the simulated images representative of images acquired during a surgical procedure, resections were introduced into the input phantom. The resections were designed to match the typical resections made during surgical treatment of refractory focal epilepsy. Hence, actual T1-weighted intra-operative scans were used as reference for lesion design. This modified phantom was used as an input to POSSUM and wrapped phase images and ground truth magnetic field values were simulated.

FIG. 5 presents quantitative unwrapping results for the method described herein and PRELUDE, which is an existing two for performing 3D phase unwrapping of images (see http://fsl.fmrib.ox.ac.uk/fsl/fsl-4.1.9/fugue/prelude.html). The results were compared with the original (ground truth) phase, and the misclassification ratio (MCR) was calculated. The MCR is the ratio of the number of voxels that were incorrectly unwrapped to the total number of voxels. Both PRELUDE and the proposed unwrapping algorithm perform comparably well under low-noise conditions. However, at higher noise levels the proposed algorithm outperforms PRELUDE both in terms of MCR and execution time. In addition, the method described herein also generates the confidence associated with the unwrapping solution and can compute it well within the time constraints associated with a neurosurgical procedure. Indeed, it is clear from FIG. 5 that the method described herein is much faster than existing algorithms such as PRELUDE.

A visual example of using the phase unwrapping algorithm described herein is shown in FIG. 2. In particular, FIG. 2(a) depicts a masked slice through a noise free wrapped image; FIG. 2(b) is the same image as FIG. 2(a) but corrupted with Gaussian noise. FIG. 2(c) shows the ground truth unwrapped image and FIG. 2(d) shows the unwrapping result obtained from PRELUDE. Some discontinuities around the lesion still exist when unwrapping with PRE-LUDE (highlighted in red). FIG. 2(e) shows the unwrapped image using the phase unwrapping algorithm described herein, with no phase discontinuities evident. FIG. 2(f) shows the confidence map generated by the method described herein in conjunction with the unwrapped image of FIG. 2(e).

Validation Using Clinical Data

The method described herein was used on 13 datasets that were acquired using interventional MRI during temporal lobe resection procedures for surgical management of temporal lobe epilepsy. The images were acquired using a 1.5 T Espree MRI scanner (Siemens, Erlangen) designed for interventional procedures. The T1-weighted MR image, used in the registration step, was acquired with a resolution of 1.1×1.1×1.3 mm using a 3D FLASH sequence with TR=5.25 ms and TE=2.5 ms. The EPI image was acquired using a single shot EPI with GRAPPA parallel imaging (acceleration factor of 2) and with a spatial resolution of 2.5×2.5×2.7 mm.

There is no immediate way to validate the susceptibility correction obtained using the described herein in the absence of a ground truth deformation. One known approach for validating other correction techniques has been to identify landmarks on the EPI and T1- or T2-weighted MR images (obtained with conventional spin or gradient echo sequences with negligible spatial distortion) and measure the distance between the landmarks before and after performing the correction. However, this approach tends to bias the results towards image registration based schemes. In addition, it is very difficult to pick reliable landmarks on interventionally acquired EPI images due to increased levels of noise and deformation. Since we are especially interested in achieving accurate artefact correction in the white matter areas, we focused on looking at the effect of susceptibility correction on residual tensor fit errors. One potentially significant source of tensor fit errors are geometric distortions arising from susceptibility artefacts. Therefore, accurate correction of susceptibility artefacts should reduce residual errors after performing tensor fitting.

The diffusion tensors were reconstructed using dtifit [33] and sum of square residual errors for the diffusion tensor fits were obtained for the 13 subjects. For the validation, the initial sum of square residual tensor fit errors were computed for all subjects. Correction was performed after unwrapping the phase maps using PRELUDE and the phase unwrapping algorithm described herein. The field maps generated using both of these methods were slightly smoothed using a low pass Gaussian filter. We also performed the correction using only the registration algorithm described above (see section E above, image registration framework), and also the method described herein based on a combination of both the field map and image registration algorithm. The quantitative results from this analysis are presented in FIG. 6. A paired t-test showed that the method described herein showed a statistically significant reduction (p-value <$10^{-3}$) in residual tensor fit errors when compared to field map and image registration based techniques alone.

FIG. 3 shows a representative slice obtained using the method described herein. It will be seen that the corrected $B_0$ image shows a good visual correspondence with the undistorted T1-weighted image. More particularly, FIG. 3 presents images shown the result of correcting for susceptibility-induced spatial distortion using the method described herein. FIG. 3(a) shows the gold-standard high resolution T1 image acquired during surgery. FIG. 3(b) shows the uncorrected $B_0$ image with a large geometric distortion around the resected area. FIG. 3(c) shows the result of correcting for susceptibility artefacts using the field map estimation method described herein. FIG. 3(d) shows further improvement of the result when the field map estimation is combined with the image registration step described herein.

3. Flowchart

FIG. 4 is a flowchart which presents a high-level overview of the processing described herein in accordance with one embodiment of the invention. The processing begins with acquiring one or more MR image(s) (operation 210). In particular, an MR image is acquired in a mode, such as EPI, that suffers from susceptibility artefacts. Note that such an MR image from an MR will usually comprise a pair of phase images or a phase difference image (which is the difference in phase at two echo times). In addition, an MR image may also be acquired in a mode that does not suffer from susceptibility artefacts—this can then be used as a reference MR image (and will be referred to as such below). Such a reference MR image may be obtained at an earlier time (e.g. not as part of the same procedure in which an EPI image is generated).

The acquired MR image that suffers from susceptibility artefacts then undergoes a phase unwrapping procedure (operation 220). As described above, this phase unwrapping may be implemented by modelling the phase using a Markov random field, and constructing a graph corresponding to the MRF. Dynamic graph cuts are then used to find the minimum energy configuration of the MRF, which in turn allows the phase unwrapped to be determined. A field map can be generated from the unwrapped phase, and this can then be converted into a deformation field (operation 230) as per known techniques. The deformation field (also referred to as a displacement field) is used to initialise a non-rigid image registration procedure as described above, which determines in effect a mapping or registration between the acquired MR image and the reference MR image (operation 240). This mapping then allows the acquired MR image to be processed to remove the susceptibility artefacts, thereby generating a corrected MR image (operation 250).

In some embodiments, the non-rigid image registration of operation 240 may be omitted. In other words, in such embodiments, the deformation field from generated from the phase unwrapping can be used directly to produce a corrected MR image. In general, the resulting correction for this approach will not be as accurate as if the image registration of operation 240 is performed—however, such reduced performance may be acceptable (or unavoidable—for example, if no reference image is available for the image registration). Irrespective of whether the image registration of operation 240 is included, the use of dynamic graph cuts to perform the phase unwrapping allows the phase unwrapping to be performed much more quickly than existing techniques—this may be of particular significance for use in (near) real-time environments, such as surgical procedures.

In some embodiments, the phase unwrapping includes the production of a confidence map, which indicates how accurate the phase unwrapping (and hence the resulting deformation field) is at any given location. This confidence map can then be utilised during the image registration of operation 240 by constraining the deformation field more tightly where confidence in the phase unwrapping is high. The use of confidence from the phase unwrapping to help control the image registration has been found to help improve the overall correction obtained. Note that the confidence map for the phase unwrapping can be efficiently produced via dynamic graph cuts as discussed above. Alternatively, other approaches to phase unwrapping, such as Monte Carlo Markov chain (MCMC), could also be employed to generate a confidence map for initialising an image registration procedure, although these other techniques will tend to be slower than the use of graph cuts.

4. Discussion

Accurate susceptibility correction is important to make effective use of diffusion imaging capabilities of interventional MRI. Susceptibility artefacts are especially severe in the interventional setting due to the presence of a resection cavity which induces large susceptibility differences. The problem is further amplified by the fact that the wide-bore MR systems often used in intra-operative applications have a smaller uniform static magnetic field region than diagnostic scanners and the subject head usually does not experience a uniform magnetic field as there is limited flexibility with regards to the head placement. This problem can be mitigated to a certain degree by filling the resection cavity with a saline solution, but this is not feasible in a majority of the interventions. The extent of distortion can also be reduced by the use of parallel imaging techniques [34] or segmented EPI acquisition [35]. However, this is not always feasible and does not completely eliminate the distortions.

The method described herein determines the uncertainty associated with the phase unwrapping solution and uses that to adaptively drive a subsequent image registration step to further improve the results in areas of high uncertainty. The method described herein can be used with regularized field map estimation techniques to account for noise in phase maps in regions of low spin density.

The method described herein can also utilize the fact that field maps tend to be piecewise smooth. (Some known techniques smooth the field map using a low pass filter; however, this can further propagate the errors, especially when the measured phase is severely corrupted). The method described herein can also combine the susceptibility correction with correction of other MRI artefacts arising from eddy currents and vibration.

The method described herein uses min-marginals as set out above to characterize uncertainty in the phase unwrapping solution. However, these are not exact marginal probabilities. Therefore, an inference scheme such as a Markov Chain Monte Carlo, or approximate ones like Variational Bayes or Expectation Propagation, could be used to characterize the posterior distributions and generate exact marginal probabilities. However, such techniques could not be completed within the time constraints of a neurosurgical procedure for current computing resources.

The accurate measurement of phase is critical in various other MRI contexts, such as flow imaging and susceptibility weighted imaging (SWI). SWI exploits the magnetic susceptibility differences between various tissues and the phase images generated from SWI are useful for the detection of cerebral microbleeds in patients with traumatic brain injuries [36]. SWI requires long echo times and suffers from severe phase wraps, especially in regions of sharp tissue susceptibility differences. This phase unwrapping algorithm described herein is fast enough to be implemented directly in the scanner acquisition and image creation pipeline.

In summary, the approach described herein allows field map and image registration based correction approaches to be combined by estimating the uncertainty associated with the phase unwrapping step and incorporating it in the subsequent registration step. Such an approach has been found to perform better than using field maps or image registration based techniques alone for interventionally acquired EPI images on a dataset of thirteen subjects. This approach could be of significant utility in image guided interventions and facilitate effective neurosurgical treatments.

Although various embodiments of the invention have been described herein, it will be appreciated that these are by way of example, and that the details of any given implementation will vary according to the particular requirements and circumstances of that implementation. Moreover, the skilled person will recognise that features from the different embodiments described herein may be combined with other embodiments as appropriate. Accordingly, the scope of the present invention is defined by the appended claims and their equivalents.

REFERENCES

[1] P. Daga, G. Winston, M. Modat, M. White, L. Mancini, M. Cardoso, M. Symms, J. Stretton, A. McEvoy, J. Thornton, C. Micallef, T. Yousry, D. Hawkes, J. Duncan, and S. Ourselin, "Accurate localization of optic radiation during neurosurgery in an interventional MRI suite," Medical Imaging, IEEE Transactions on, vol. 31, no. 4, pp. 882-891, April 2012.

[2] G. P. Winston, P. Daga, J. Stretton, M. Modat, M. R. Symms, A. W. McEvoy, S. Ourselin, and J. S. Duncan, "Optic radiation tractography and vision in anterior temporal lobe resection," Annals of Neurology, vol. 71, no. 3, pp. 334-341, 2012.

[3] X. Chen, D. Weigel, O. Ganslandt, M. Buchfelder, and C. Nimsky, "Prediction of visual field deficits by diffusion tensor imaging in temporal lobe epilepsy surgery," NeuroImage, vol. 45, no. 2, pp. 286-297, 2009.

[4] G. Sun, X. Iei Chen, Y. Zhao, F. Wang, Z.-J. Song, Y. bo Wang, D. Wang, and B. nan Xu, "Intraoperative MRI with integrated functional neuronavigation-guided resection of supratentorial cavernous malformations in eloquent brain areas," Journal of Clinical Neuroscience, vol. 18, no. 10, pp. 1350-1354, 2011.

[5] G. Andrea, A. Angelini, A. Romano, A. Di Lauro, G. Sessa, A. Bozzao, and L. Ferrante, "Intraoperative dti and brain mapping for surgery of neoplasm of the motor cortex and the corticospinal tract: our protocol and series in brainsuite," Neurosurgical Review, vol. 35, pp. 401-412, 2012.

[6] P. Jezzard and R. Balaban, "Correction for geometric distortion in echo planar images from B0 field variations," Magnetic Resonance in Medicine, vol. 34, no. 1, pp. 65-73, 1995.

[7] A. Funai, J. Fessler, D. Yeo, V. Olafsson, and D. Noll, "Regularized field map estimation in MRI," IEEE Transactions on Medical Imaging, vol. 27, no. 10, pp. 1484-1494, 2008.

[8] M. Jenkinson, "Fast, automated, n-dimensional phase-unwrapping algorithm," Magnetic Resonance in Medicine, vol. 49, no. 1, pp. 193-197, 2003.

[9] M. Wu, L. Chang, L. Walker, H. Lemaitre, A. Barnett, S. Marenco, and C. Pierpaoli, "Comparison of EPI distortion correction methods in diffusion tensor MRI using a novel framework," in MICCAI, 2008, pp. 321-329.

[10] J. Kybic, P. Thevenaz, A. Nirkko, and M. Unser, "Unwarping of unidirectionally distorted EPI images," IEEE Transactions on Medical Imaging, vol. 19, no. 2, pp. 80-93, 2000.

[11] D. Merhof, G. Soza, A. Stadlbauer, G. Greiner, and C. Nimsky, "Correction of susceptibility artifacts in diffusion tensor data using non-linear registration," Medical Image Analysis, vol. 11, no. 6, pp. 588-603, 2007.

[12] R. Tao, P. Fletcher, S. Gerber, and T. Whitaker, "A variational image based approach to the correction of susceptibility artifacts in the alignment of diffusion weighted and structural MRI," in IPMI, 2009, pp. 664-675.

[13] H. Huang, C. Ceritoglu, X. Li, A. Qiu, M. I. Miller, P. C. van Zijl, and S. Mori, "Correction of B0 susceptibility induced distortion in diffusion-weighted images using large-deformation diffeomorphic metric mapping," Magnetic Resonance Imaging, vol. 26, no. 9, pp. 1294-1302, 2008.

[14] M. O. Irfanoglu, L. Walker, S. Sammet, C. Pierpaoli, and R. Machiraju, "Susceptibility distortion correction for echo planar images with non-uniform b-spline grid sampling: a diffusion tensor image study," in MICCAI, 2011, pp. 174-181.

[15] M. Jenkinson, J. L. Wilson, and P. Jezzard, "Perturbation method for magnetic field calculations of nonconductive objects," Magnetic Resonance in Medicine, vol. 52, no. 3, 2004.

[16] C. Studholme, R. Constable, and J. Duncan, "Accurate alignment of functional EPI data to anatomical MRI using a physics-based distortion model," Medical Imaging, IEEE Transactions on, vol. 19, no. 11, pp. 1115-1127, nov. 2000.

[17] L. Ruthotto, H. Kugel, J. Olesch, B. Fischer, J. Modersitzki, M. Burger, and C. H. Wolters, "Diffeomorphic susceptibility artifact correction of diffusion-weighted magnetic resonance images," Physics in Medicine and Biology, vol. 57, no. 18, p. 5715, 2012.

[18] L. Ying, Z.-P. Liang, J. Munson, D. C., R. Koetter, and B. Frey, "Unwrapping of MR phase images using a markov random field model," Medical Imaging, IEEE Transactions on, pp. 128-136, 2006.

[19] S. Z. Li, "Markov random field models in computer vision," in Proceedings of the third European conference on Computer Vision (Vol. II), 1994, pp. 361-370.

[20] Y. Boykov, O. Veksler, and R. Zabih, "Fast approximate energy minimization via graph cuts," IEEE Transactions on Pattern Analysis and Machine Intelligence, vol. 23, p. 2001, 2001.

[21] V. Kolmogorov and R. Zabin, "What energy functions can be minimized via graph cuts?" PAMI, IEEE Transactions on, pp. 147-159, 2004.

[22] L. R. Ford and D. R. Fulkerson, Flows in Networks. Princeton University Press, 1962.

[23] D. Tisdall and M. S. Atkins, "MRI denoising via phase error estimation," in Proc. SPIE, 5747, 2005, pp. 646-654.

[24] P. Kohli and P. H. S. Torr, "Measuring uncertainty in graph cut solutions," Comput. Vis. Image Underst., pp. 30-38, 2008.

[25] B. Glocker, N. Komodakis, G. Tziritas, N. Navab, and N. Paragios, "Dense image registration through MRFs and efficient linear programming," Medical Image Analysis, pp. 731-741, 2008.

[26] R. W. K. So, T. W. H. Tang, and A. C. S. Chung, "Non-rigid image registration of brain magnetic resonance images using graph-cuts," Pattern Recogn., vol. 44, no. 10-11, October 2011.

[27] D. Rueckert, L. Sonoda, C. Hayes, D. Hill, M. Leach, and D. Hawkes, "Nonrigid registration using free-form deformations: Application to breast MR images," Medical Imaging, IEEE Transactions on, vol. 18, no. 8, pp. 712-721, 1999.

[28] X. Zhuang, S. Arridge, D. Hawkes, and S. Ourselin, "A nonrigid registration framework using spatially encoded mutual information and free-form deformations," Medical Imaging, IEEE Transactions on, pp. 1819-1828, 2011.

[29] C. Studholme, H. D., and H. D., "An overlap invariant entropy measure of 3d medical image alignment," Pattern Recognition, vol. 32, no. 1, pp. 71-86, January 1999.

[30] I. Drobnjak, D. Gavaghan, E. Sli, J. Pitt-Francis, and M. Jenkinson, "Development of a functional magnetic resonance imaging simulator for modeling realistic rigid-body motion artifacts," Magnetic Resonance in Medicine, vol. 56, pp. 364-80, 2006.

[31] I. Drobnjak, G. Pell, and M. Jenkinson, "Simulating the effects of time-varying magnetic fields with a realistic simulated scanner," Magnetic Resonance Imaging, vol. 28, no. 7, pp. 1014-21, September 2010.

[32] D. Collins, A. Zijdenbos, V. Kollokian, J. Sled, N. Kabani, C. Holmes, and A. Evans, "Design and construction of a realistic digital brain phantom," Medical Imaging, IEEE Transactions on, vol. 17, no. 3, pp. 463-468, june 1998.

[33] S. M. Smith, M. Jenkinson, M. W. Woolrich, C. F. Beckmann, T. E. Behrens, H. Johansen-Berg, P. R. Bannister, M. D. Luca, I. Drobnjak, D. E. Flitney, R. K. Niazy, J. Saunders, J. Vickers, Y. Zhang, N. D. Stefano, J. M. Brady, and P. M. Matthews, "Advances in functional and structural MR image analysis and implementation as FSL," NeuroImage, vol. 23, Supplement 1, no. 0, pp. S208-S219, 2004.

[34] K. P. Pruessmann, "Encoding and reconstruction in parallel mri," NMR in Biomedicine, vol. 19, no. 3, pp. 288-299, 2006.

[35] D. Atkinson, D. A. Porter, D. L. Hill, F. Calamante, and A. Connelly, "Sampling and reconstruction effects due to motion in diffusion-weighted interleaved echo planar imaging," Magnetic Resonance in Medicine, vol. 44, no. 1, pp. 101-109, 2000.

[36] E. Haacke, S. Mittal, Z. Wu, J. Neelavalli, and Y.-C. Cheng, "Susceptibility-weighted imaging: Technical aspects and clinical applications, part 1," American Journal of Neuroradiology, vol. 30, no. 1, pp. 19-30, January 2009.

What is claimed is:

1. A method of correcting susceptibility artefacts in an acquired magnetic resonance image comprising the steps of:

performing phase unwrapping for an acquired magnetic resonance (MR) image, including computing a confidence for the phase unwrapping for each voxel of the acquired MR image;

generating a field map for the acquired magnetic resonance image from the unwrapped phase;

converting the field map to a deformation field; and using the deformation field to initialise a non-rigid image registration of the acquired MR image against a reference image, wherein the deformation field of the non-rigid registration is controlled to be smoother where said confidence is high.

2. The method of claim 1, wherein performing the phase unwrapping for an acquired magnetic resonance (MR) image comprises:

modelling the MR phase in the MR image using a Markov random field (MRF) in which the true phase $\phi(t)$ and the wrapped phase $\phi(w)$ are modelled as random variables such that at voxel i of said MR image $\phi(t)(i)=\phi(w)(i)+2\pi n(i)$, where n(i) is an unknown integer that needs to be estimated for each voxel i;

constructing a graph consisting of a set of vertices V and edges E and two special terminal vertices representing a source s and sink t, where there is a one-to-one correspondence between cuts on the graph and configurations of the MRF, a cut representing a partition of the vertices V into disjoint sets S and T such that s∈S and t∈T;

finding the minimum energy configuration, $E(n(i)|\phi(w))$ of the MRF on the basis that the total cost of a given cut represents the energy of the corresponding MRF configuration, where the cost of a cut is the sum of all edges going from S to T across the cut boundary; and using the values of n(i) in the minimum energy configuration to perform the phase unwrapping from $\phi(w)$ to $\phi(t)$ for the MR image.

3. The method of claim 2, wherein the MR phase is modelled as a piecewise smooth function where the smooth component is due to the inhomogeneities in the static MR field and the non-smooth component arises due to changes in magnetic susceptibility from one tissue type to another, and wherein the spatial smoothness is enforced by modelling the true phase as the MRF and a smoothness model is incorporated by using a potential function.

4. The method of claim 3, wherein the true phase is modelled as a six-neighbourhood pairwise MRF where a convex pairwise potential function is defined between immediately adjacent neighbouring voxels.

5. The method of claim 4, wherein the convex pairwise potential function is sum of squared differences.

6. The method of claim 2, further comprising weighting voxel contributions on the basis that phase measurements in low signal areas of the MR image tend to be less reliable, such that phase measurements in high signal areas of the MR image are assigned a higher weight that phase measurements in low signal areas of the MR image.

7. The method of claim 6, wherein the weight assigned to a given voxel corresponds to the probability that the contribution of noise to the phase of a given voxel is less than $\epsilon$ radians, where $\epsilon$ is set to be a small value greater than zero.

8. The method of claim 7, further comprising selecting a region in the MR image containing only air to determine the noise variance of the MR image, wherein said noise variance is then used for determining the weight to be assigned to a given voxel.

9. The method of claim 2, wherein computing a confidence comprises performing a confidence estimation at each voxel for the phase unwrapping.

10. The method of claim 9, wherein the confidence associated with a given label for a random variable is estimated as the ratio of the min-marginal energy associated with that labelling to the sum of the min-marginal energies for that random variable for all possible labels, wherein the min-marginal is the minimum energy obtained when a random variable is constrained to take a certain label and the minimisation is performed over all remaining variables.

11. The method of claim 10, wherein the confidence is computed for each voxel using dynamic graph cuts.

12. The method of claim 11, wherein using dynamic graph cuts comprises constraining a given MRF node to belong to the source or sink by adding an infinite capacity edge between the given MRF node and the respective terminal node, and computing the min-marginal energies by optimizing the resulting MRF.

13. The method of claim 1, wherein the confidence is computed for each voxel using one of the following techniques: Expectation Propagation, Variational Bayes, Markov Chain Monte Carlo (MCMC) and Hamiltonian MCMC simulations.

14. The method of claim 1, wherein generating the field map comprises using the unwrapped phase from two MR images or the unwrapped phase difference between the two MR images to estimate a field map.

15. The method of claim 14, further comprising converting the field map into a deformation field.

16. The method of claim 15, wherein the deformation field is used to initialise a non-rigid image registration of the acquired MR image against a reference image.

17. The method of claim 16, wherein the deformation field for performing the non-rigid image registration is parameterised using cubic B-splines, where the B-splines are constrained to move only in the phase encode direction.

18. The method of claim 17, wherein a similarity measure used for the non-rigid image registration is based on local information which encodes spatial context by varying the contribution of voxels according to their spatial coordinates.

19. The method of claim 18, wherein the non-rigid image registration is represented as a discrete set of displacements in the phase encode direction, and the non-rigid image registration is modelled as a first-order Markov random field.

20. The method of claim 19, wherein the first derivative of the deformation field for the non-rigid image registration is penalised to ensure a smooth transformation.

21. The method of claim 20, wherein a penalty term for penalising the first derivative of the deformation field is modulated by the confidence computed for each voxel, such that the penalty weight is higher in regions of high confidence than in regions of low confidence.

22. The method of claim 1, wherein a confidence for each voxel of the field map is determined from the computed confidence for the phase unwrapping and an estimate of uncertainty in the MR image, and wherein the confidence of the field map is used to control the smoothness of the deformation field.

23. A method of performing phase unwrapping for an acquired magnetic resonance (MR) image comprising:

modelling the MR phase in the MR image using a Markov random field (MRF) in which the true phase $\phi(t)$ and the wrapped phase $\phi(w)$ are modelled as random variables such that at voxel i of said MR image $\phi(t)(i)=\phi$ (w)(i)+2πn(i), where n(i) is an unknown integer that needs to be estimated for each voxel i;

constructing a graph consisting of a set of vertices V and edges E and two special terminal vertices representing a source s and sink t, where there is a one-to-one correspondence between cuts on the graph and configurations of the MRF, a cut representing a partition of the vertices V into disjoint sets S and T such that s∈S and t∈T;

finding the minimum energy configuration, E(n(i)|φ(w)) of the MRF on the basis that the total cost of a given cut represents the energy of the corresponding MRF configuration, where the cost of a cut is the sum of all edges going from S to T across the cut boundary;

using the values of n(i) in the minimum energy configuration to perform the phase unwrapping from φ(w) to φ(t) for the MR image; and performing a confidence estimation at each voxel for the phase unwrapping.

24. The method of claim 23, wherein the MR phase is modelled as a piecewise smooth function where the smooth component is due to the inhomogeneities in the static MR field and the non-smooth component arises due to changes in magnetic susceptibility from one tissue type to another, and wherein the spatial smoothness is enforced by modelling the true phase as the MRF and a smoothness model is incorporated by using a potential function.

25. The method of claim 24, wherein the true phase is modelled as a six-neighbourhood pairwise MRF where a convex pairwise potential function is defined between immediately adjacent neighbouring voxels.

26. The method of claim 25, wherein the convex pairwise potential function is sum of squared differences.

27. The method of claim 23, further comprising weighting voxel contributions on the basis that phase measurements in low signal areas of the MR image tend to be less reliable, such that phase measurements in high signal areas of the MR image are assigned a higher weight that phase measurements in low signal areas of the MR image.

28. The method of claim 27, wherein the weight assigned to a given voxel corresponds to the probability that the contribution of noise to the phase of a given voxel is less than ε radians, where ε is set to be a small value greater than zero.

29. The method of claim 28, further comprising selecting a region in the MR image containing only air to determine the noise variance of the MR image, wherein said noise variance is then used for determining the weight to be assigned to a given voxel.

30. The method of claim 22, wherein the confidence associated with a given label for a random variable is estimated as the ratio of the min-marginal energy associated with that labelling to the sum of the min-marginal energies for that random variable for all possible labels, wherein the min-marginal is the minimum energy obtained when a random variable is constrained to take a certain label and the minimisation is performed over all remaining variables.

31. The method of claim 29, wherein the confidence is computed for each voxel using dynamic graph cuts.

32. The method of claim 31, wherein using dynamic graph cuts comprises constraining a given MRF node to belong to the source or sink by adding an infinite capacity edge between the given MRF node and the respective terminal node, and computing the min-marginal energies by optimizing the resulting MRF.

33. The method of claim 23, further comprising generating a field map using an unwrapped phase from each of two MR images or an unwrapped phase difference between the two MR images to estimate the field map.

34. The method of claim 33, further comprising converting the field map into a deformation field.

35. The method of claim 34, wherein the deformation field is used to initialise a non-rigid image registration of the acquired MR image against a reference image.

36. The method of claim 35, wherein the deformation field for performing the non-rigid image registration is parameterised using cubic B-splines, where the B-splines are constrained to move only in the phase encode direction.

37. The method of claim 36, wherein a similarity measure used for the non-rigid image registration is based on local information which encodes spatial context by varying the contribution of voxels according to their spatial coordinates.

38. The method of claim 37, wherein the non-rigid image registration is represented as a discrete set of displacements in the phase encode direction, and the non-rigid image registration is modelled as a first-order Markov random field.

39. The method of claim 38, wherein the first derivative of the deformation field for the non-rigid image registration is penalised to ensure a smooth transformation.

40. The method of claim 39, wherein a penalty term for penalising the first derivative of the deformation field is modulated by the confidence computed for each voxel, such that the penalty weight is higher in regions of high confidence than in regions of low confidence.

41. Apparatus for correcting susceptibility artefacts in an acquired magnetic resonance image, the apparatus being configured to perform the operations of:

performing phase unwrapping for an acquired magnetic resonance (MR) image, including computing a confidence for the phase unwrapping for each voxel of the acquired MR image;

generating a field map for the acquired magnetic resonance image from the unwrapped phase;

converting the field map to a deformation field; and using the deformation field to initialise a non-rigid image registration of the acquired MR image against a reference image, wherein the deformation field of the non-rigid registration is controlled to be smoother where said confidence is high.

42. The apparatus of claim 41, wherein said apparatus is an MR system for supporting image-guided surgery.

43. A non-transitory computer-readable storage medium storing instructions that when executed by a computer cause the computer to perform a method for correcting susceptibility artefacts in an acquired magnetic resonance image, the method comprising:

performing phase unwrapping for an acquired magnetic resonance (MR) image, including computing a confidence for the phase unwrapping for each voxel of the acquired MR image;

generating a field map for the acquired magnetic resonance image from the unwrapped phase;

converting the field map to a deformation field; and using the deformation field to initialise a non-rigid image registration of the acquired MR image against a reference image, wherein the deformation field of the non-rigid registration is controlled to be smoother where said confidence is high.

* * * * *